United States Patent
Kim et al.

(10) Patent No.: US 10,003,041 B2
(45) Date of Patent: *Jun. 19, 2018

(54) ORGANIC LIGHT EMITTING DIODE AND ORGANIC LIGHT EMITTING DISPLAY DEVICE INCLUDING THE SAME

(71) Applicant: SAMSUNG DISPLAY CO., LTD., Yongin, Gyeonggi-Do (KR)

(72) Inventors: Dong Chan Kim, Hwaseong-si (KR); Won Jong Kim, Suwon-si (KR); Eung Do Kim, Seoul (KR); Dong Kyu Seo, Suwon-si (KR); Da Hea Im, Incheon (KR); Sang Hoon Yim, Suwon-si (KR); Chang Woong Chu, Hwaseong-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 160 days.

This patent is subject to a terminal disclaimer.

(21) Appl. No.: 14/735,582

(22) Filed: Jun. 10, 2015

(65) Prior Publication Data

US 2016/0056403 A1 Feb. 25, 2016

(30) Foreign Application Priority Data

Aug. 21, 2014 (KR) .................. 10-2014-0109197

(51) Int. Cl.
*H01L 51/50* (2006.01)
*H01L 51/00* (2006.01)
*H01L 27/32* (2006.01)

(52) U.S. Cl.
CPC ...... *H01L 51/5092* (2013.01); *H01L 27/3244* (2013.01); *H01L 51/0059* (2013.01); *H01L 51/0072* (2013.01); *H01L 51/0073* (2013.01); *H01L 51/0074* (2013.01); *H01L 2251/301* (2013.01); *H01L 2251/303* (2013.01)

(58) Field of Classification Search
None
See application file for complete search history.

(56) References Cited

U.S. PATENT DOCUMENTS

| 5,677,572 | A | 10/1997 | Hung et al. |
| 6,416,888 | B1 * | 7/2002 | Kawamura ......... H01L 51/5088 257/101 |

(Continued)

FOREIGN PATENT DOCUMENTS

| CN | 102655164 A | 9/2012 |
| JP | 2005-251587 A | 9/2005 |

(Continued)

OTHER PUBLICATIONS

Machine Translation of JP 2009-044104 A (pub. 2009).*
KR 10-2012-0054453 abstract (pub. 2012).*
Abstract of JP 2009-044104 A (pub. 2009).*

(Continued)

*Primary Examiner* — Kevin M Bernatz
(74) *Attorney, Agent, or Firm* — Lee & Morse, P.C.

(57) ABSTRACT

An organic light emitting diode, including a first electrode and a second electrode facing each other; an emission layer between the first electrode and the second electrode; and an electron injection layer between the second electrode and the emission layer, the electron injection layer including a metal having a work function of 4.0 eV or less and a dipole material including a first component and a second component having different polarities.

25 Claims, 9 Drawing Sheets

(56) References Cited

U.S. PATENT DOCUMENTS

| | | | |
|---|---|---|---|
| 7,868,536 B2* | 1/2011 | Aurongzeb | H01L 51/5092 |
| | | | 313/503 |
| 2005/0274961 A1 | 12/2005 | Iou | |
| 2006/0273712 A1 | 12/2006 | Yaegashi | |
| 2007/0007882 A1* | 1/2007 | Fukuoka | H01L 51/0051 |
| | | | 313/503 |
| 2010/0148158 A1* | 6/2010 | Kim | C07C 2/86 |
| | | | 257/40 |
| 2012/0148158 A1 | 6/2012 | DeSpain | |
| 2012/0223633 A1* | 9/2012 | Yoshinaga | H01L 27/3211 |
| | | | 313/504 |
| 2012/0299037 A1 | 11/2012 | Lee et al. | |
| 2013/0313527 A1 | 11/2013 | Kim | |
| 2014/0191209 A1* | 7/2014 | Han | H01L 27/3211 |
| | | | 257/40 |
| 2015/0194633 A1* | 7/2015 | Lee | C07D 487/14 |
| | | | 257/40 |
| 2015/0200379 A1* | 7/2015 | Kim | H01L 51/508 |
| | | | 257/40 |
| 2016/0035979 A1* | 2/2016 | Lee | H01L 51/5092 |
| | | | 257/40 |

FOREIGN PATENT DOCUMENTS

| | | | | |
|---|---|---|---|---|
| JP | 2009044104 A | * | 2/2009 | ......... H01L 51/5088 |
| KR | 10-2012-0042473 A | | 5/2012 | |
| KR | 10-1182447 B1 | | 9/2012 | |
| TW | 200917893 A | | 4/2009 | |
| TW | 201133977 A | | 10/2011 | |

OTHER PUBLICATIONS

X. J. Wang, Enhancement of electron injection in organic light-emitting devices using an Ag/LiF cathode; Journal of Applied Physics, 95, 3828 (Nov. 27, 2014).

Provisional double patenting rejection over claims of the above-identified application; USPTO Office action dated Jul. 10, 2017, in U.S. Appl. No. 14/731,729.

Chinese Office action dated Nov. 30, 2017 for corresponding Chinese Patent Application No. 201510514649.X.

Chinese Office action dated Nov. 30, 2017 for co-pending Chinese Patent Application No. 201510508265.7.

USPTO Office action dated Jan. 23, 2018 for related U.S. Appl. No. 14/821,983.

* cited by examiner

ORGANIC LIGHT EMITTING DIODE AND ORGANIC LIGHT EMITTING DISPLAY DEVICE INCLUDING THE SAME

CROSS-REFERENCE TO RELATED APPLICATION

Korean Patent Application No. 10-2014-0109197, filed on Aug. 21, 2014, in the Korean Intellectual Property Office, and entitled: "Organic Light Emitting Diode and Organic Light Emitting Display Device Including the Same," is incorporated by reference herein in its entirety.

BACKGROUND

1. Field

Provided are an organic light emitting diode and an organic light emitting display device including the same.

2. Description of the Related Art

Lightweight and thin personal computers and televisions sets may require lightweight and thin display devices, and flat panel displays satisfying such requirements may be substituted for cathode ray tubes (CRTs). A liquid-crystal display (LCD) is a passive display device, an additional backlight as a light source is needed, and an LCD may exhibit a slow response time and a narrow viewing angle.

SUMMARY

Embodiments may be realized by providing an organic light emitting diode, including a first electrode and a second electrode facing each other; an emission layer between the first electrode and the second electrode; and an electron injection layer between the second electrode and the emission layer, the electron injection layer including a metal having a work function of 4.0 eV or less and a dipole material including a first component and a second component having different polarities.

The dipole material may have a dipole moment that is higher than that of LiF.

The first component may include one or more of an alkali metal, an alkaline earth metal, a rare earth metal, or a transition metal, and the second component may include a halogen.

The second component may include one or more of F, Cl, Br, or I.

The dipole material may include one or more of RbF, RbBr, RbCl, or RbI.

The metal having the work function of 4.0 eV or less may include one or more of Li, Na, K, Rb, Cs, Ca, Sr, Ba, Ce, Sm, Eu, Gd, La, Nd, Tb, Lu, Yb, Mg, or an alloy thereof.

The electron injection layer may include a dipole material including RbI and a metal including Mg.

The electron injection layer may further include an oxide having relative permittivity of 10 or more.

The oxide may include one or more of $WO_3$, $MoO_3$, $Cu_2O$, $Yb_2O_3$, $Sm_2O_3$, $Nb_2O_3$, $Gd_2O_3$, or $Eu_2O_3$.

The electron injection layer may include at least two oxides each having relative permittivity of 10 or more.

The organic light emitting diode may further include an electron transport layer between the emission layer and the electron injection layer; and a hole transport layer between the emission layer and the first electrode. Each of the hole transport layer and the electron transport layer may include an organic material.

The electron injection layer may include an oxide having relative permittivity of 10 or more.

The electron injection layer may have a structure including a plurality of layers, and each of the layers may include at least one of the dipole material, the metal having the work function of 4.0 eV or less, and the oxide having relative permittivity of 10 or more.

Embodiments may be realized by providing an organic light emitting display device, including a substrate; a gate line on the substrate; a data line and a driving voltage line; a switching thin film transistor connected to the gate line and the data line; a driving thin film transistor connected to the switching thin film transistor and the driving voltage line; and an organic light emitting diode connected to the driving thin film transistor. The organic light emitting diode includes a first electrode and a second electrode facing each other; an emission layer between the first electrode and the second electrode; and an electron injection layer between the second electrode and the emission layer, the electron injection layer including a metal having a work function of 4.0 eV or less and a dipole material including a first component and a second component having different polarities.

The dipole material may have a dipole moment that is higher than that of LiF.

The first component may include one or more of an alkali metal, an alkaline earth metal, a rare earth metal, or a transition metal, and the second component may include a halogen.

The second component may include or more of F, Cl, Br, or I.

The dipole material may include or more of RbF, RbBr, RbCl, or RbI.

The metal having the work function of 4.0 eV or less may include one or more of Li, Na, K, Rb, Cs, Ca, Sr, Ba, Ce, Sm, Eu, Gd, La, Nd, Tb, Lu, Yb, Mg, or an alloy thereof.

The electron injection layer may include a dipole material including RbI and the metal having the work function of 4.0 eV or less may include Mg.

The first component may have a work function of 3.0 eV or less, and may include one or more of Li, Na, K, Rb, Cs, Ca, Sr, Ba, Ce, Sm, Eu, Gd, Yb, or an alloy thereof.

The electron injection layer may include an oxide having relative permittivity of 10 or more.

The oxide may include one or more of $WO_3$, $MoO_3$, $Cu_2O$, $Yb_2O_3$, $Sm_2O_3$, $Nb_2O_3$, $Gd_2O_3$, or $Eu_2O_3$.

The electron injection layer may include at least two oxides each having relative permittivity of 10 or more.

The organic light emitting display device may further include an electron transport layer between the emission layer and the electron injection layer; and a hole transport layer between the emission layer and the first electrode. Each of the hole transport layer and the electron transport layer may include an organic material.

The emission layer may include a red light emitting layer, a green light emitting layer, and a blue light emitting layer, and the emission layer may further include an auxiliary layer at a lower end of the blue light emitting layer.

The organic light emitting element may further include a red resonance auxiliary layer disposed below the red light emission layer and a green resonance auxiliary layer disposed below the green light emission layer.

The auxiliary layer may include a compound represented by the following Chemical Formula 1:

Chemical Formula 1

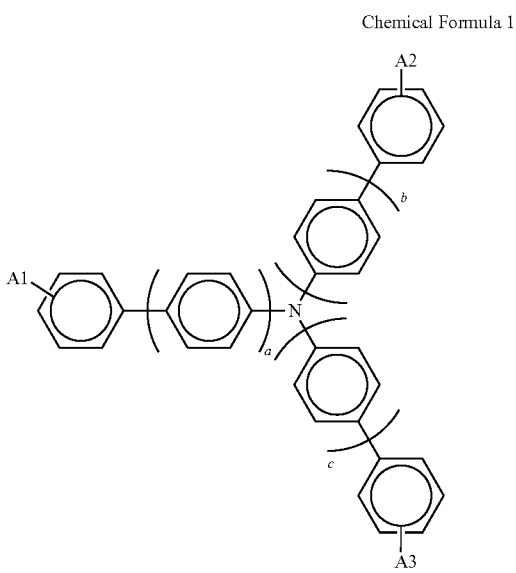

where each of "A1," "A2," and "A3" may be an alkyl group, an aryl group, carbazole, dibenzothiophene, dibenzofuran (DBF), or biphenyl, and each of "a," "b," and "c" may be an integer in a range of from 0 and 4.

The auxiliary layer may include a compound represented by the following Chemical Formula 2:

Chemical Formula 2

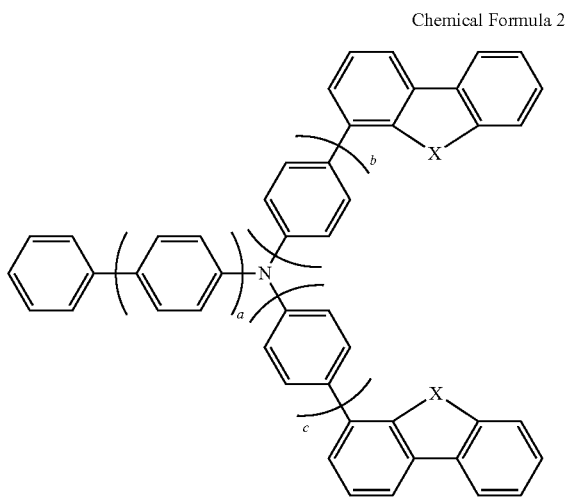

where each of "a," "b," and "c" may be an integer in a range of from 0 to 3, "X" may be selected from O, N, and S, and the elements selected for X may be the same as or different from each other.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
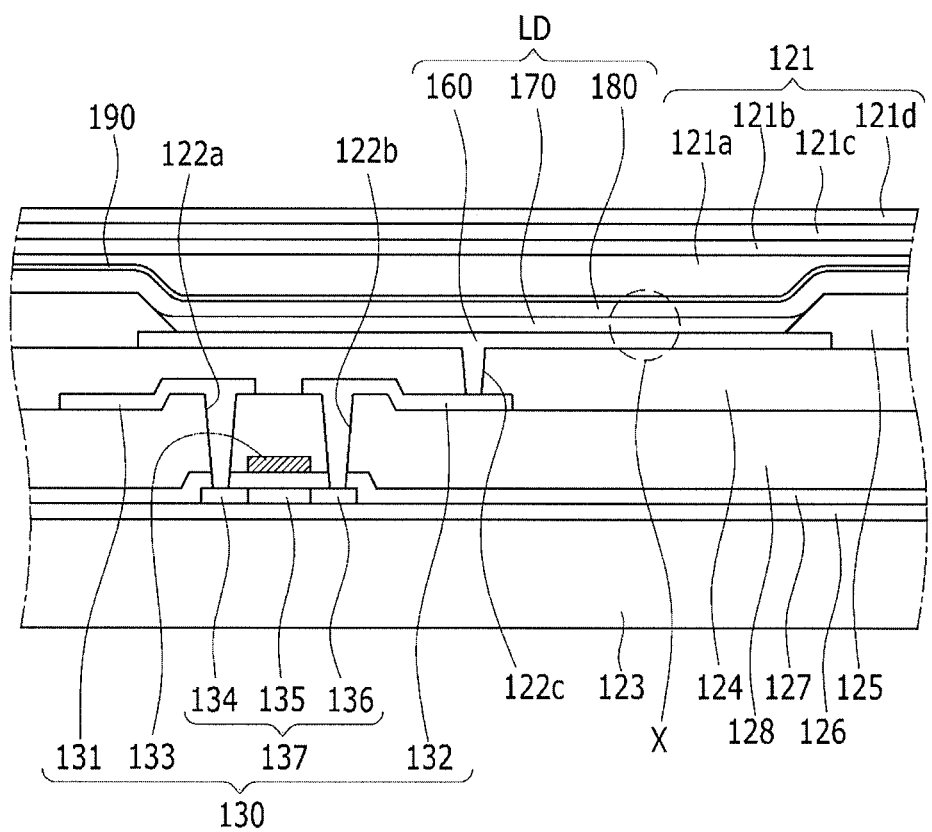
FIG. 1 illustrates a cross-sectional view of an organic light emitting display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the thickness and dimensions of layers, films, panels, regions, etc., may be exaggerated for clarity. It will be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals designate like elements throughout the specification.

Figure 2:
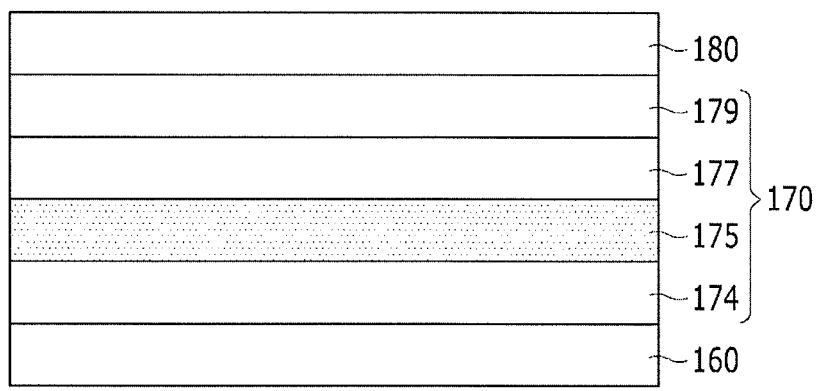
FIG. 2 illustrates an enlarged cross-sectional view of the organic light emitting diode as shown in FIG. 1.

FIG. 1 illustrates a cross-sectional view of an organic light emitting display device according to an exemplary embodiment. FIG. 2 illustrates an enlarged cross-sectional view of the organic light emitting diode as shown in FIG. 1.

Referring to FIG. 1 and FIG. 2, the organic light emitting display device according to the exemplary embodiment may include a substrate 123, a thin film transistor 130, a first electrode 160, a light-emitting element layer 170, and a second electrode 180. The first electrode 160 and the second electrode 180 may respectively be an anode and a cathode, or vice versa.

The substrate 123 may be made of, e.g., an inorganic material such as glass, an organic material such as polycarbonate (PC), polymethylmethacrylate (PMMA), polyethylene terephthalate (PET), polyamide (PA), polyethersulfone (PES), or a combination thereof, or a silicon wafer.

A substrate buffer layer 126 may be formed on the substrate 123. The substrate buffer layer 126 may prevent penetration of impurities and planarize the surface.

The substrate buffer layer 126 may be made of various materials capable of performing the functions. For example, one of a silicon nitride (SiNx) layer, a silicon oxide (SiOx) layer, and a silicon oxynitride (SiOxNy) layer may be used as the substrate buffer layer 126. In an embodiment, the substrate buffer layer 126 may be omitted according to a kind of substrate 123 and a process condition.

A driving semiconductor layer 137 may be formed on the substrate buffer layer 126. The driving semiconductor layer 137 may be formed of a material including polysilicon. The driving semiconductor layer 137 may include a channel region 135 in which impurities (dopants) are not doped, and a source region 134 and a drain region 136 in which the impurities are doped at respective sides of the channel region 135. The doped ion materials may be P-type impurities such as boron (B), for example, $B_2H_6$. The impurities vary according to a kind of thin film transistor.

A gate insulating layer 127 made of a silicon nitride (SiNx) or silicon oxide (SiOx) may be formed on the driving semiconductor layer 137. A gate wire including a driving gate electrode 133 may be formed on the gate insulating layer 127. The driving gate electrode 133 may be formed to overlap at least a part of the driving semiconductor layer 137, for example, the channel region 135.

An interlayer insulating layer 128 covering the driving gate electrode 133 may be formed on the gate insulating layer 127. A first contact hole 122a and a second contact hole 122b exposing the source region 134 and the drain region 136 of the driving semiconductor layer 137 are respectively formed in the gate insulating layer 127 and the interlayer insulating layer 128. The interlayer insulating layer 128 may be formed by using a material such as a silicon nitride (SiNx) or a silicon oxide (SiOx), like the gate insulating layer 127.

A data wire including a driving source electrode 131 and a driving drain electrode 132 may be formed on the interlayer insulating layer 128. The driving source electrode 131 and the driving drain electrode 132 may be connected with the source region 134 and the drain region 136 of the driving semiconductor layer 137 through the first contact hole 122a and the second contact hole 122b formed in the interlayer insulating layer 128 and the gate insulating layer 127, respectively.

The driving thin film transistor 130 including the driving semiconductor layer 137, the driving gate electrode 133, the driving source electrode 131, and the driving drain electrode 132 may be formed. The configuration of the driving thin film transistor 130 may be variously modified.

A planarization layer 124 covering the data wire may be formed on the interlayer insulating layer 128. The planarization layer 124 may remove and planarize a step, and may increase emission efficiency of the organic light emitting element to be formed thereon. The planarization layer 124 may have a third contact hole 122c exposing a part of the drain electrode 132.

The planarization layer 124 may be made of one or more materials of a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

In an embodiment, one of the planarization layer 124 and the interlayer insulating layer 128 may be omitted.

A first electrode of the organic light emitting element, for example, a pixel electrode 160, may be formed on the planarization layer 124. For example, the organic light emitting diode device may include a plurality of pixel electrodes 160 which may be disposed for every plurality of pixels, respectively. The pixel electrodes 160 may be spaced apart from each other. The pixel electrode 160 may be connected to the drain electrode 132 through the third contact hole 122c of the planarization layer 124.

A pixel defining layer 125 having an opening exposing the pixel electrode 160 may be disposed on the planarization layer 124. For example, a plurality of openings respectively corresponding to the pixels may be formed between pixel defining layers 125. The light-emitting element layer 170 may be formed for each opening formed by the pixel defining layer 125. Accordingly, a pixel area in which each light-emitting element layer 170 may be formed by the pixel defining layer 125 may be defined.

The pixel electrode 160 may be disposed to correspond to the opening of the pixel defining layer 125. In an embodiment, the pixel electrode 160 is not disposed only in the opening of the pixel defining layer 125, but may be disposed below the pixel defining layer 125 so that a part of the pixel electrode 160 overlaps with the pixel defining layer 125.

The pixel defining layer 125 may be made of, for example, resin such as a polyacrylate resin and a polyimide, or a silica-based inorganic material.

The light-emitting element layer 170 may be formed on the pixel electrode 160. A structure of the light-emitting element layer 170 will be described below in detail.

The second electrode, for example, a common electrode 180, may be formed on the light-emitting element layer 170. The organic light emitting diode LD including the pixel electrode 160, the light-emitting element layer 170, and the common electrode 180 may be formed.

Each of the pixel electrode 160 and the common electrode 180 may be made of a transparent conductive material or a transflective or reflective conductive material. According to kinds of materials forming the pixel electrode 160 and the common electrode 180, the organic light emitting diode device may be a top emission type, a bottom emission type, or a double-sided emission type.

An overcoat 190 covering and protecting the common electrode 180 may be formed as an organic layer on the common electrode 180.

A thin film encapsulation layer 121 may be formed on the overcoat 190. The thin film encapsulation layer 121 may encapsulate and protect the organic light emitting element LD and a driving circuit part formed on the substrate 123 from the external environment.

The thin film encapsulation layer 121 may include organic encapsulation layers 121a and 121c and inorganic encapsulation layers 121b and 121d which may be alternately laminated. In FIG. 1, as an example, two organic encapsulation layers 121a and 121c and two inorganic encapsulation layers 121b and 121d may be alternately laminated to configure the thin film encapsulation layer 121.

Hereinafter, an organic light emitting diode according to an exemplary embodiment will be described with reference to FIG. 2.

Referring to FIG. 2, the organic light emitting diode according to the present exemplary embodiment (i.e., a part X shown in FIG. 1) may include a structure in which a first electrode 160, a hole transport layer 174, an emission layer 175, an electron transport layer 177, an electron injection layer 179, and a second electrode 180 may be sequentially stacked.

The first electrode 160 may be the anode, may be made of a material selected from materials having high work functions, and the hole injection may be made easier. The first electrode 160 may be a transparent electrode or a non-transparent electrode. The first electrode 160 may be the transparent electrode, and may be formed to have a thin thickness by using a conductive oxide such as indium tin oxide (ITO), indium zinc oxide (IZO), tin oxide ($SnO_2$), zinc oxide (ZnO), or a combination thereof, or a metal such as aluminum, silver, and magnesium. The first electrode 160 may be a non-transparent electrode, and may be formed by using a metal such as aluminum, silver and magnesium.

The first electrode 160 may be formed to have a structure of two or more layers including different materials. For example, the first electrode 160 may be formed to have a structure in which indium tin oxide (ITO), silver (Ag), and indium tin oxide (ITO) may be sequentially stacked.

The first electrode 160 may be formed by using, for example, a sputtering method or a vacuum deposition method.

The hole transport layer 174 may be disposed on the first electrode 160. The hole transport layer 174 may facilitate smooth transport of the holes transferred from the first electrode 160. The hole transport layer 174 may include an organic material. For example, the hole transport layer 174 may be formed of N,N-di(1-naphthyl)-N,N'-di(phenyl)benzidine (NPD), N,N-bis(3-methylphenyl)-N,N-bis(phenyl) (TPD), s-TAD, or 4,4',4"-tris(N-3-methylphenyl-N-phenyl-amino)-triphenylamine (MTDATA).

The thickness of the hole transport layer 174 may be in a range of from 15 nm to 25 nm. For example, the thickness of the hole transport layer 174 may be 20 nm. As a modification of the hole transport layer 174 according to the present exemplary embodiment, a hole transport/injection layer may be formed by adding a hole injection material into the hole transport layer 174.

The emission layer 175 may be disposed on the hole transport layer 174. The emission layer 175 may contain a light emitting material for displaying a predetermined color. For example, the emission layer 175 may display a primary color such as blue, green, or red, or a combination thereof.

The thickness of the emission layer 175 may be in a range of from 10 nm to 50 nm. The emission layer 175 may contain a host and a dopant. The emission layer 175 may contain materials for emitting red, green, blue, and white light, and may be formed by using a phosphorescent or a fluorescent material.

The emission layer 175 may emit red light, may contain a host material including carbazole biphenyl (CBP) or 1,3-bis(carbazol-9-yl) (mCP), and may be formed of a phosphorescent material containing a dopant including one or more of, for example, PIQIr(acac) (bis(1-phenylisoquinoline)acetylacetonate iridium), PQIr(acac) (bis(1-phenylquinoline)acetylacetonate iridium), PQIr (tris(1-phenylquinoline)iridium), or PtOEP (platinum octaethylporphyrin).

The emission layer 175 may emit green light, may contain a host material including CBP or mCP, and may be formed of a phosphorescent material containing a dopant including Ir(ppy)3 (fac-tris(2-phenylpyridine)iridium) or a phosphorescent material containing a dopant including Alq3 (tris(8-hydroxyquinolino)aluminum).

The emission layer 175 may emit green light, may contain a host material including CBP or mCP, and may be formed of a phosphorescent material containing a dopant (4,6-F2ppy)2Irpic. The emission layer 175 may be formed of a phosphorescent material containing one or more of spiro-DPVBi, spiro-6P, distyryl benzene (DSB), distyryl arylene (DSA), a PFO-based polymer, or a PPV-based polymer.

The electron transport layer 177 may be disposed on the emission layer 175. The electron transport layer 177 may facilitate transfer of electrons from the second electrode 180 to the emission layer 175. The electron transport layer 177 may help prevent the holes injected from the first electrode 160 from moving to the second electrode 180 through the emission layer 175. The electron transport layer 177 may serve as a hole blocking layer, and may improve combination of the holes and electrons in the emission layer 175.

The electron transport layer 177 may include an organic material. For example, the electron transport layer 177 may be formed of one or more of Alq3 (tris(8-hydroxyquinolino) aluminum), PBD, TAZ, Spiro-PBD, BAlq, or SAlq.

The electron injection layer 179 may be disposed on the electron transport layer 177. The electron injection layer 179 may improve electron injection from the second electrode 180 to the electron transport layer 177. In the present exemplary embodiment, the electron injection layer 179 may include a dipole material formed by coupling a first component and a second component having different polarities. The first component may be an element which may be changed to a positive ion when the dipole material is ionized, and the second component may be an element which may be changed to a negative ion.

The dipole material may have a dipole moment that is higher than that of LiF. For example, the dipole moment of LiF may be 6.28 Debye, and, in the present exemplary embodiment, the dipole moment of the dipole material may be higher than 6.28 Debye. Referring to the periodic table, the first component of the dipole material may include one or more of an alkali metal, an alkaline earth metal, a rare earth metal, or a transition metal, and the second component may include a halogen. For example, the first component may include one or more of Li, Na, K, Rb, Cs, Be, Mg, Ca, Sr, or Ba, the second component may include one or more of F, Cl, Br, or I, and the dipole material may include one or more of RbF, RbBr, RbCl, or RbI.

In the organic light emitting diode LD according to the present exemplary embodiment, the electron injection layer 179 may include a metal having a work function of 4.0 eV or less and/or an oxide having relative permittivity of 10 or more in addition to the dipole material. The electron injection layer 179 may be formed by co-deposition of at least two of oxides each having relative permittivity of 10 or more and the metal having the work function of 4.0 eV or less.

In the present exemplary embodiment, examples of the metal having the work function of 4.0 eV or less may include one or more of Li, Na, K, Rb, Cs, Ca, Sr, Ba, Ce, Sm, Eu, Gd, La, Nd, Tb, Lu, Mg, or an alloy thereof. The electron injection layer 179 may be formed as a single layer by co-deposition of the metal having the work function of 4.0 eV or less and the dipole material. For example, the electron injection layer 179 may be formed by co-deposition of a dipole material including RbI and a metal including Mg.

Table 1 demonstrates the efficiency when the electron injection layer is formed by co-deposition of RbI doped with Mg according to an exemplary embodiment. In Comparative Example 1 the electron injection layer was made of Yb, and in each of Examples 1 to 4 the electron injection layer was made of RbI doped with Mg. A cathode that was disposed adjacent to the electron injection layer was made of AgMg, and the Mg content of the cathode in Examples 1 to 4 was 10 volume %, 15 volume %, 20 volume %, and 30 volume %, respectively. In Examples 1 to 4, the electron injection layer was formed to have a thickness of 10 Å.

TABLE 1

| | R efficiency | G efficiency | B efficiency (CE/y) | W efficiency | Increment |
|---|---|---|---|---|---|
| Comparative Example 1 | 55.8 | 115.0 | 129.3 | 46.0 | Ref. |
| Example 1 | 57.9 | 122.7 | 134.9 | 48.6 | 5.6% |
| Example 2 | 58.6 | 125.0 | 140.9 | 50.1 | 8.8% |
| Example 3 | 58.2 | 121.5 | 137.7 | 49.0 | 6.5% |
| Example 4 | 58.2 | 177.5 | 130.5 | 47.2 | 2.6% |

Referring to Table 1, Examples 1 to 4 respectively accomplished white efficiencies which were improved by 5.6%, 8.8%, 6.5%, and 2.6% as compared with Comparative Example 1. The Mg content of the cathode may be in a range of from 10 volume % to 30 volume %, for example, from 10 volume % to 20 volume %.

Table 2 demonstrates the efficiency when the electron injection layer is formed by co-deposition of RbI doped with Mg according to an exemplary embodiment. In Comparative Example 2 the electron injection layer was made of Yb, and in each of Examples 5 and 6 the electron injection layer was made of RbI doped with Mg. In Examples 5 and 6, the electron injection layers were formed to have thicknesses of 10 and 20 Å, respectively.

TABLE 2

|  | R efficiency | G efficiency | B efficiency (CE/y) | W efficiency | Increment |
|---|---|---|---|---|---|
| Comparative Example 2 | 55.8 | 115.0 | 129.3 | 46.0 | Ref. |
| Example 5 | 58.3 | 117.7 | 132.3 | 47.6 | 3.5% |
| Example 6 | 58.3 | 118.1 | 133.4 | 47.8 | 4.0% |

Referring to Table 2, Examples 5 and 6 respectively accomplished white efficiencies which were improved by 3.5% and 4.0% as compared with Comparative Example 2.

In the present exemplary embodiment, as for the thickness of the electron injection layer, the minimum value may be determined as 5 Å in consideration of a process margin, and the maximum value may be determined as 50 Å in consideration of the intended function of the electron injection layer. The thickness of the electron injection layer may be in a range of from 5 to 50 Å, for example, in a range of from 10 to 20 Å.

In the present exemplary embodiment, examples of the oxide having relative permittivity of 10 or more may include one or more of $WO_3$, $MoO_3$, $Cu_2O$, $Yb_2O_3$, $Sm_2O_3$, $Nb_2O_3$, $Gd_2O_3$, or $Eu_2O_3$.

The organic light emitting diode LD according to an exemplary embodiment may accomplish smoother electron injection and strong resistance to an external oxygen or moisture by selectively adding a combination of the metal having the work function of 4.0 eV or less and the oxide having relative permittivity of 10 or more into a dipole material having a lower dissociation energy and a higher dipole moment than those of LiF.

For example, without being bound by theory, it is believed that, when a voltage is applied to opposite ends of the electrode, a dipole material of an ion joining state in which positive charges and negative charges may be arranged in a dipole thin film (e.g., the electron injection layer in the present exemplary embodiment) according to an electric field. Electrons disposed at an interface between the electron transport layer 177 and the dipole thin film may be coupled to the dipole material of the dipole thin film, and holes disposed at an interface between the dipole thin film and the second electrode 180 that may serve as the cathode may be coupled to the dipole material of the dipole thin film. Many surplus electrons or holes as the offset amount for voltage maintenance may exist in the interface between the electron transport layer 177 and the dipole thin film or between the dipole thin film and the second electrode 180. A material like RbI included in the electron injection layer 179 according to the present exemplary embodiment may be a polar molecule having dipole moments without an electric field. The dipole moments may be present at a larger number, and electrons or holes to be coupled to the dipole material at the interface may exist at a larger number. Thus, a larger amount of electrons or holes may be present in the interface. For example, the interface of the organic electron transport layer 177 which may be positively charged by gathering holes may be represented as spaces at which electrons may be removed, which may indicate many empty spaces to which electrons may move. A vacuum level of the interface of the organic electron transport layer 177 may be shifted (a LUMO level may be decreased), and an injection barrier may be lowered. The metal having the work function of 4.0 eV or less may serve as a positively charged interface, for example, due to an electron donor characteristic, and the electron injection characteristic may be further improved.

The second electrode 180 may be disposed on the electron injection layer 179. The second electrode 180 may serve as the cathode, may include a material having a small work function, and may help make the electron injection easier. An example of the material having the small work function may include, for example, a metal such as magnesium, calcium, sodium, potassium, titanium, indium, yttrium, lithium, gadolinium, aluminum, silver, tin, lead, cesium, barium, or an alloy thereof, or a multi-layer structure substance such as LiF/Al, $LiO_2$/Al, LiF/Ca, LiF/Al, and $BaF_2$/Ca The aforementioned second electrode 180 may be made of an alloy, an alloy ratio may be controlled according to a temperature of a deposition source, an atmosphere, and a vacuum degree, and may be selected to have an appropriate ratio value.

The second electrode 180 may be configured to have two or more layers.

Figure 3:
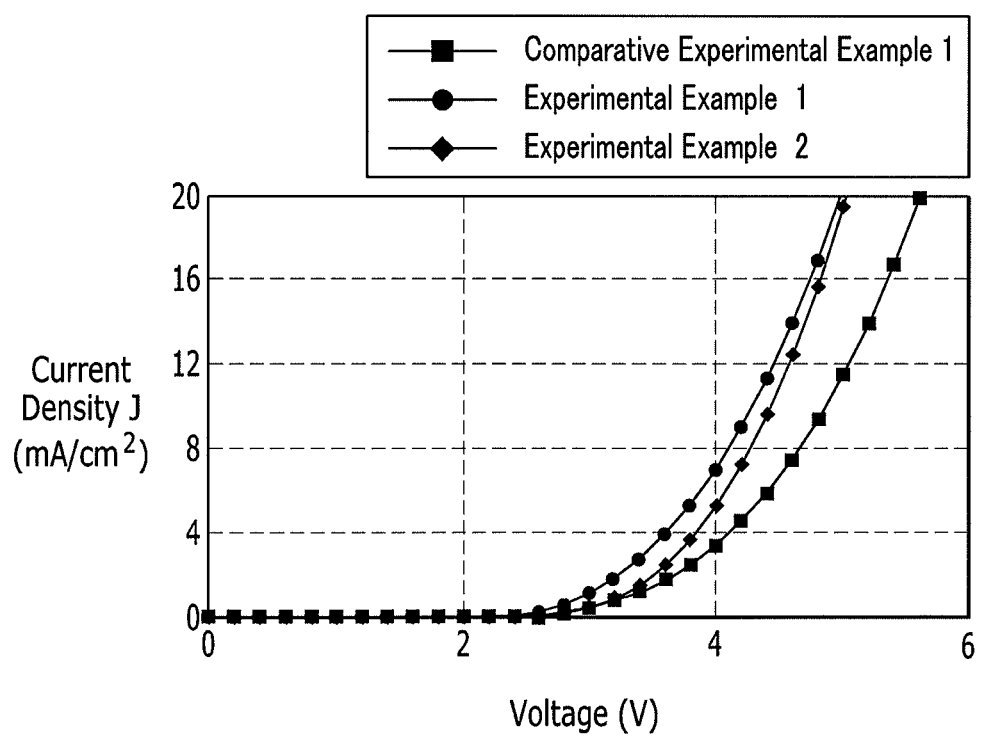
FIG. 3 to FIG. 5 illustrate graphs of a voltage-current density in each of a red pixel, a green pixel, and a blue pixel in the organic light emitting diode shown in FIG. 2.
Figure 4:
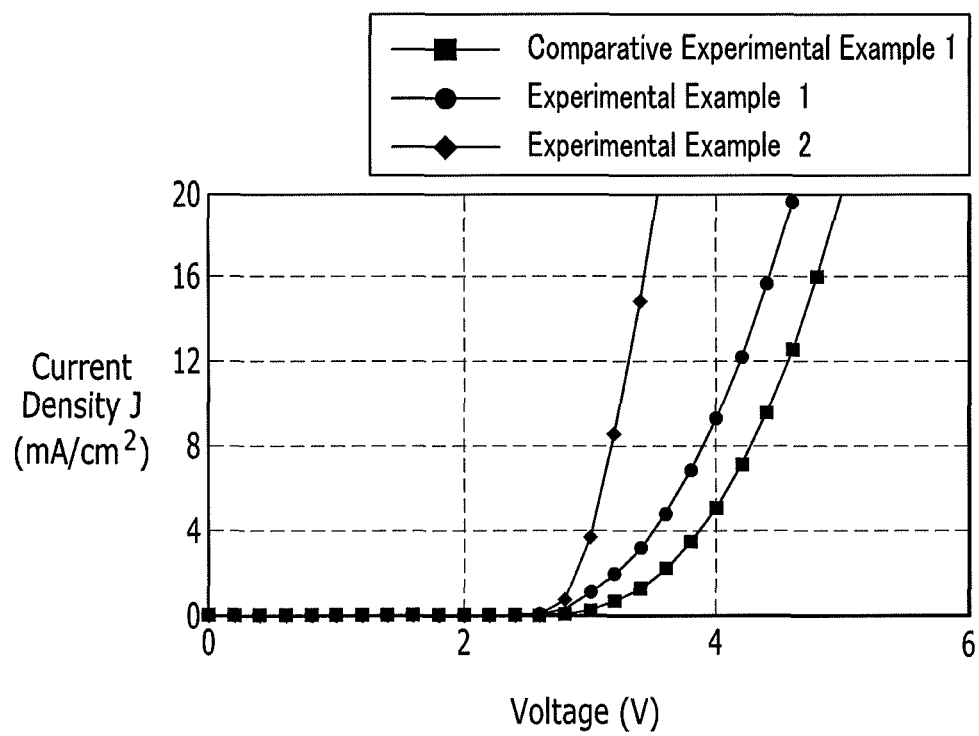
Figure 5:
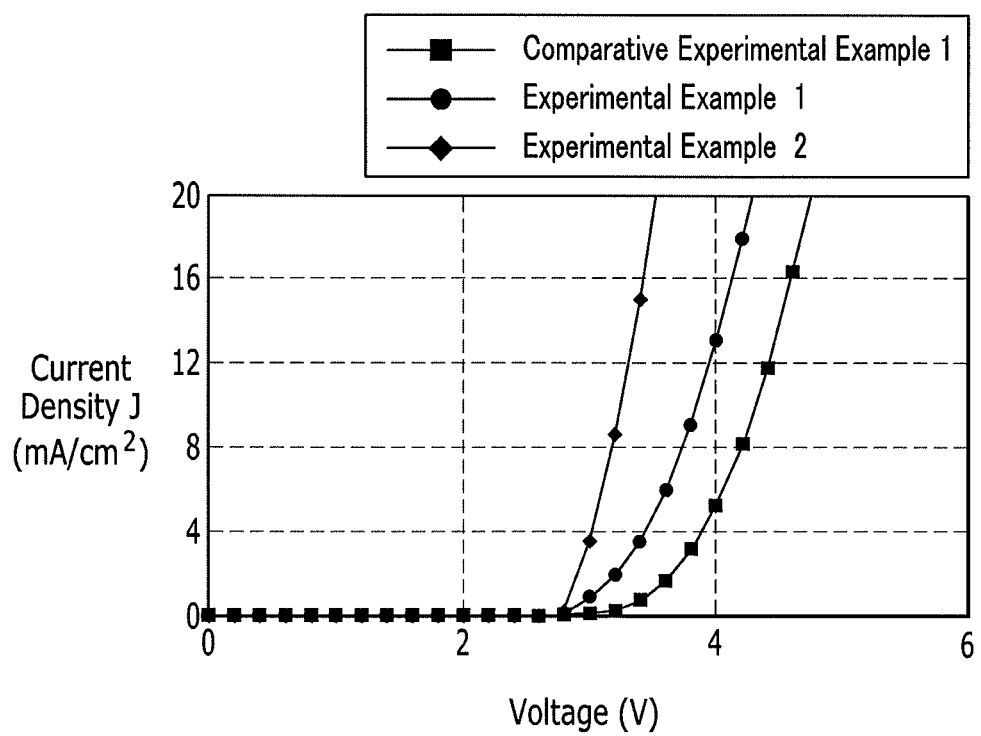

FIG. 3 to FIG. 5 illustrate graphs of a voltage-current density in each of a red pixel, a green pixel, and a blue pixel in the organic light emitting diode shown in FIG. 2.

In FIG. 3 to FIG. 5, in Comparative Experimental Example 1 the electron injection layer was made of Yb, in Experimental Example 1 the electron injection layer was made of RbI, and in Experimental Example 2 the electron injection layer was made of RbI:Mg (a mixture of RbI and Mg).

Referring to FIG. 3 to FIG. 5, an electron injection rate was increased in Experimental Examples 1 and 2, in which the electron injection layer was made of RbI or RbI:Mg, from the point that Experimental Examples 1 and 2 show a low threshold voltage (Vth) and a steep inclination as compared with Comparative Experimental Example 1.

Figure 6:
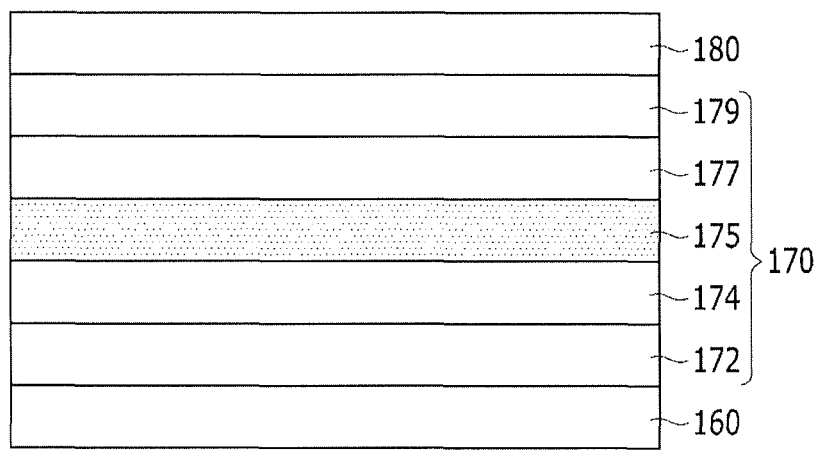
FIG. 6 illustrates a cross-sectional view of a modification of the organic light emitting diode shown in FIG. 2.

FIG. 6 illustrates a cross-sectional view of a modification of the organic light emitting diode shown in FIG. 2;

For example, FIG. 6 illustrates a structure in which a hole injection layer 172 may be added into the organic light emitting diode LD in the exemplary embodiment of FIG. 2. In the present exemplary embodiment, the hole injection layer 172 may be disposed between the hole transport layer 174 and the first electrode 160. The hole injection layer 172 may facilitate easier injection of holes from the first electrode 160 to the hole transport layer 174. In the present exemplary embodiment, the hole injection layer 172 may include a dipole material in which a metal or a non-metal having a work function of 4.3 eV or more and a halogen may be combined. In an embodiment, the hole injection layer 172 may be formed of an inorganic material or an organic material.

The metal or the non-metal having the work function of 4.3 eV or more may include one or more of Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, or Zn.

The description made with reference to FIG. 2 other than the aforementioned difference is applicable to the modification of FIG. 6.

Figure 7:
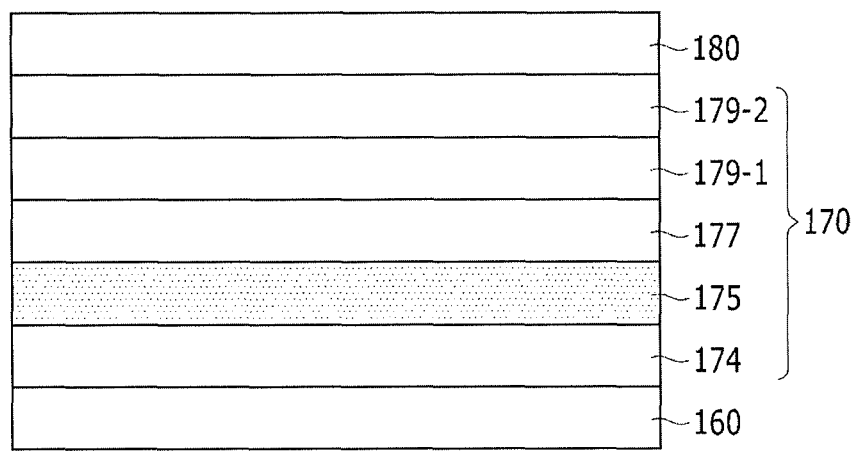
FIG. 7 illustrates a cross-sectional view of a modification of the organic light emitting diode shown in FIG. 2.

FIG. 7 illustrates a cross-sectional view of a modification of the organic light emitting diode shown in FIG. 2.

For example, FIG. 7 illustrates the same structure as that of the organic light emitting diode LD in the exemplary embodiment of FIG. 2, except that the electron injection layer 179 may be formed to have two layers. In the present exemplary embodiment, the electron injection layer 179 may include a first electron injection layer 179-1 and a second electron injection layer 179-2. Each of the first electron injection layer 179-1 and the second electron injection layer 179-2 may be formed by using at least one of a dipole material having a first component and a second component which have different polarities, a metal having a work function of 4.0 eV or less, and an oxide having relative permittivity of 10 or more, or by co-deposition of at least two of these materials. The first electron injection layer 179-1 and the second electron injection layer 179-2 may be formed of the same material, or may include different materials.

The description made with reference to FIG. 2 other than the aforementioned difference is applicable to the modification of FIG. 7.

Figure 8:
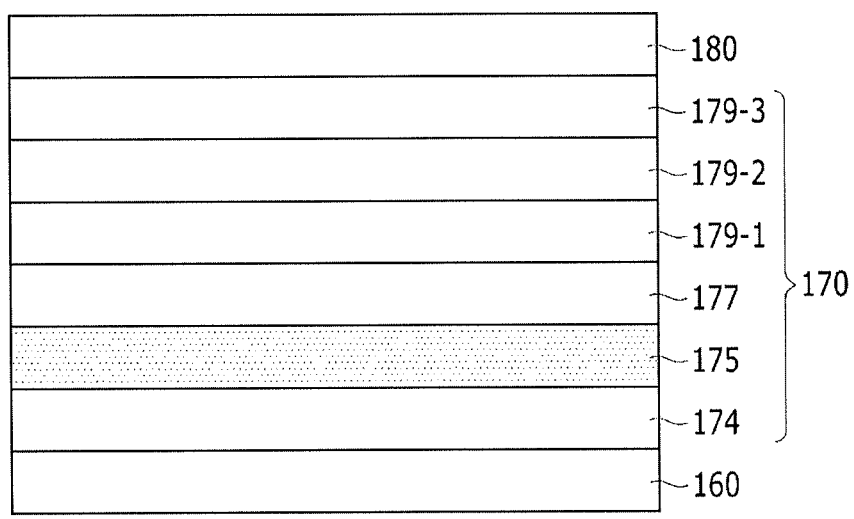
FIG. 8 illustrates a cross-sectional view of a modification of the organic light emitting diode shown in FIG. 2.

FIG. 8 illustrates a cross-sectional view of a modification of the organic light emitting diode shown in FIG. 2.

For example, FIG. 8 illustrates the same structure as that of the organic light emitting diode LD in the exemplary embodiment of FIG. 2, except that the electron injection layer 179 may be formed to have three layers. In the present exemplary embodiment, the electron injection layer 179 may include a first electron injection layer 179-1, a second electron injection layer 179-2, and a third electron injection layer 179-3. Each of the first electron injection layer 179-1, the second electron injection layer 179-2, and the third electron injection layer 179-3 may be formed by using at least one of a dipole material having a first component and a second component which have different polarities, a metal having a work function of 4.0 eV or less, and an oxide having relative permittivity of 10 or more, or by co-deposition of at least two of these materials. The first electron injection layer 179-1, the second electron injection layer 179-2, and the third electron injection layer 179-3 may be formed of the same material, or may include different materials.

The description made with reference to FIG. 2 other than the aforementioned difference is applicable to the modification of FIG. 8.

Figure 9:
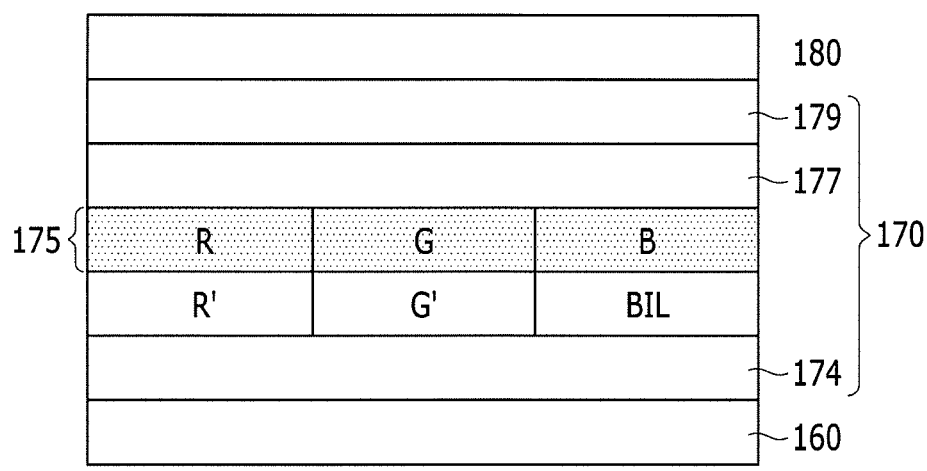
FIG. 9 illustrates a cross-sectional view of a modification of the organic light emitting diode shown in FIG. 2.

FIG. 9 illustrates a cross-sectional view of a modification of the organic light emitting diode shown in FIG. 2.

For example, FIG. 9 illustrates a modification of the emission layer 175 in the organic light emitting diode LD of FIG. 2. In the present exemplary embodiment, the emission layer 175 may include a red emission layer R, a green emission layer G, a blue emission layer B, and an auxiliary layer BIL for increasing efficiency of the blue light emitting layer B disposed at a lower end thereof.

The thickness of the red light emitting layer R may be in a range of from about 30 nm to about 50 nm, the thickness of the green light emitting layer G may be in a range of from about 10 nm to about 30 nm, and thickness of the blue light emitting layer B may be in a range of from about 10 nm to about 30 nm. The thickness of the auxiliary layer BIL may be about 20 nm. The auxiliary layer BIL may serve to adjust a hole charge balance, and may improve the efficiency of the blue light emitting layer B. The auxiliary layer BIL may contain a compound that is represented by the following Chemical Formula 1.

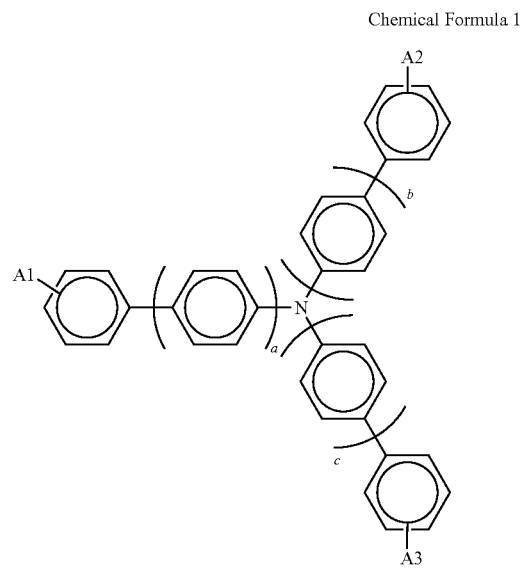

Chemical Formula 1

In Chemical Formula 1, each of "A1," "A2," and "A3" may be an alkyl group, an aryl group, carbazole, dibenzothiophene, dibenzofuran (DBF), or biphenyl, and each of "a," "b," and "c" may be an integer in a range of from 0 to 4.

Examples of compounds represented by the chemical formula 1 may include the following Chemical Formulae 1-1, 1-2, 1-3, 1-4, 1-5, and 1-6.

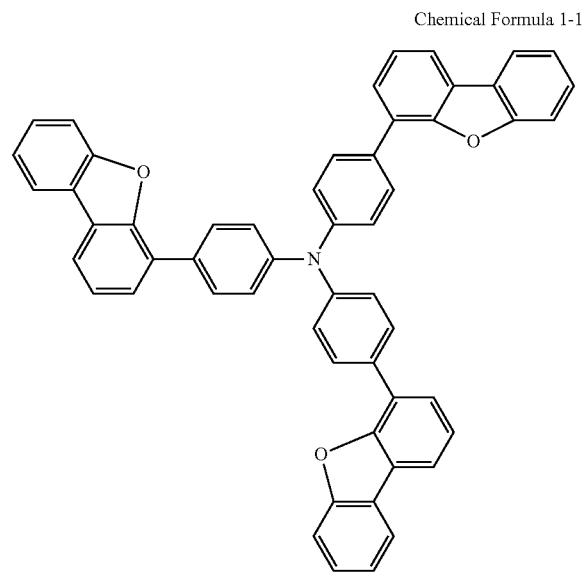 [SMILES: c1ccc2c(c1)oc1c(-c3ccc(N(c4ccc(-c5cccc6c5oc5ccccc56)cc4)c4ccc(-c5cccc6c5oc5ccccc56)cc4)cc3)cccc12]

Chemical Formula 1-1

Chemical Formula 1-2
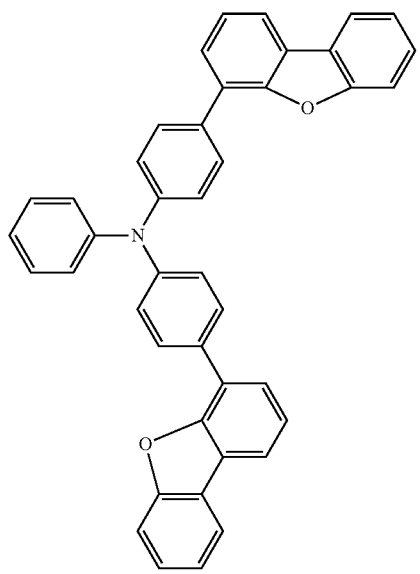
Chemical Formula 1-3
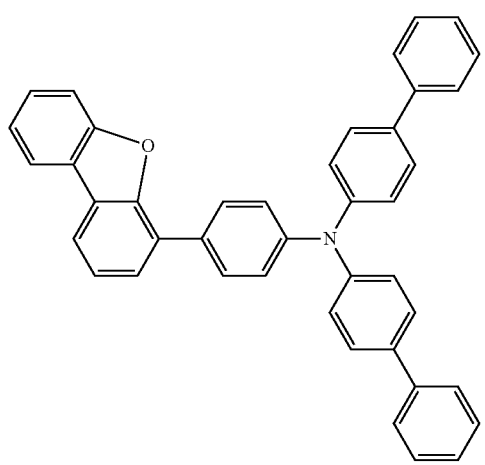
Chemical Formula 1-4
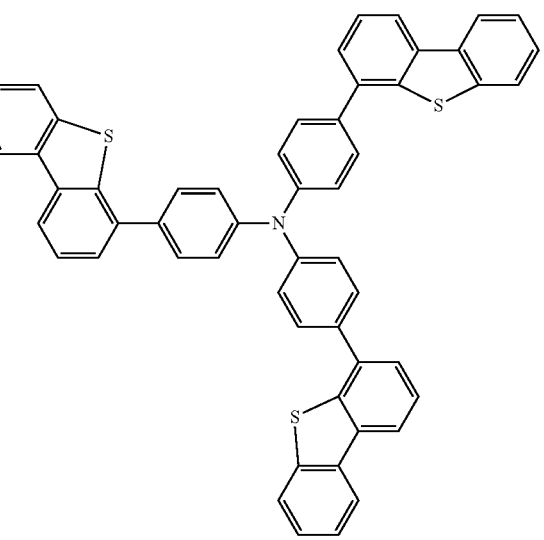
Chemical Formula 1-5
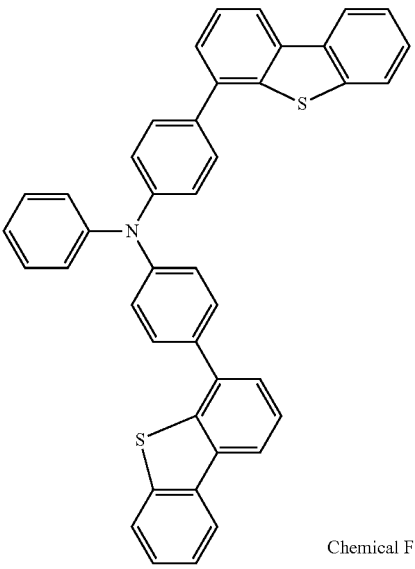
Chemical Formula 1-6
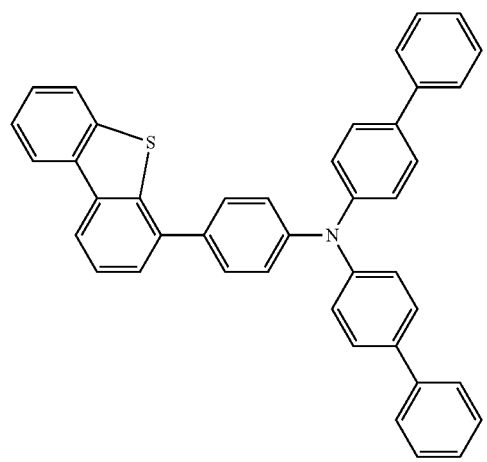
According to an exemplary embodiment, the auxiliary layer BIL may contain a compound that is represented by the following Chemical Formula 2.
Chemical Formula 2
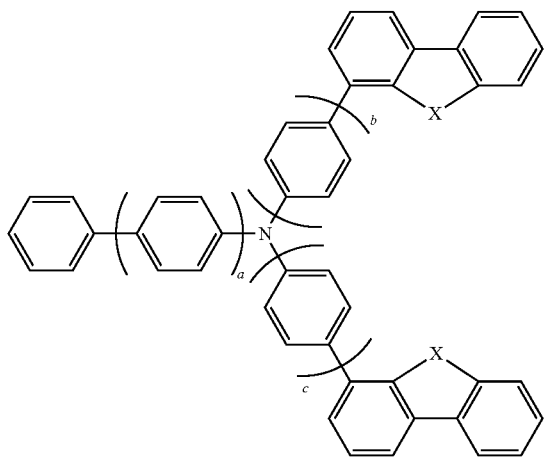

In Chemical Formula 2, each of "a," "b," and "c" may be an integer in a range of from 0 to 3, "X" may be selected from O, N, and S, and the elements selected for X may be the same as or different from each other.
Examples of compounds represented by Chemical Formula 2 may include the following Chemical Formulae 2-1 to 2-6.
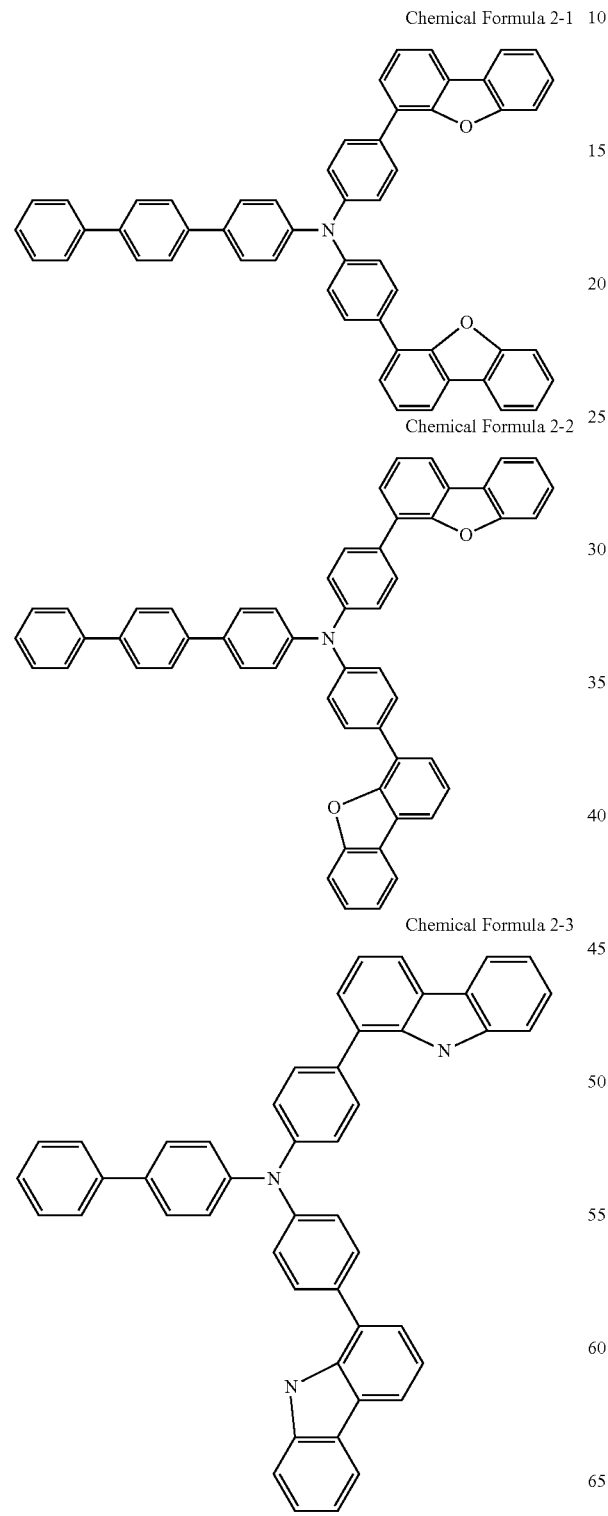
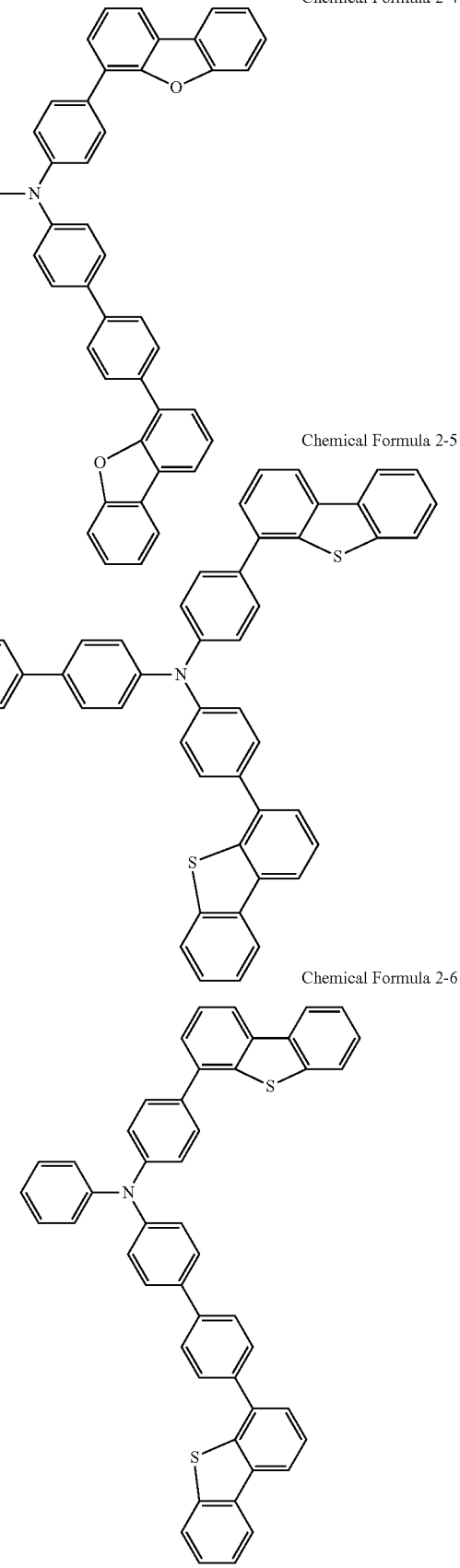

According to an exemplary embodiment, the auxiliary layer BIL may contain a compound that is represented by the following Chemical Formula 3.

Chemical Formula 3

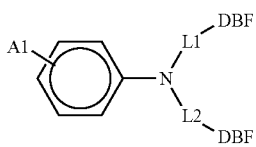

In Chemical Formula 3, "A1" may be an alkyl group, an aryl group, carbazole, dibenzothiophene, or dibenzofuran (DBF), and each of L1 and L2 may be

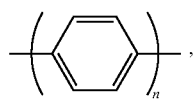

n being an integral in a range of from 0 to 3. The DBF connected to L1 and L2 may be substituted with carbazole or dibenzothiophene.

Hereinafter, a synthesis method of the auxiliary layer BIL according to an exemplary embodiment will be described. As one example, the synthesis method of Chemical Formula 1-1 will be described.

Chemical Formula 1-1

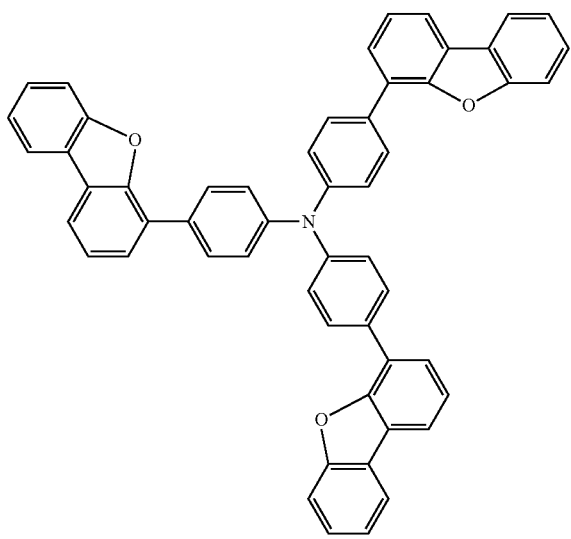

Synthesis Example

Under an argon atmosphere, 6.3 g of 4-dibenzofuranboronic acid, 4.8 g of 4,4', 4"-tribromotriphenylamine, 104 mg of tetrakis(triphenylphosphine)palladium (Pd(PPh$_3$)$_4$), 48 ml of a 2M solution of sodium carbonate (Na$_2$CO$_3$), and 48 ml of toluene were put into a 300 ml three-neck flask, and then they were reacted at a temperature of 80° C. for 8 hours. The reaction liquid was extracted by using toluene and water, and the extract was dried by using sodium sulfate anhydrous. The resultant mixture was concentrated under a reduced pressure, and a crude product obtained was refined through a column purifying process, thereby obtaining 3.9 g of a whitish yellow powder.

Referring to FIG. 9, a red resonance auxiliary layer R' may be disposed below the red light emission layer R, and a green resonance auxiliary layer G' may be disposed below the green light emission layer G. The red resonance auxiliary layer R' and the green resonance auxiliary layer G' are layers that set a resonant distance (a resonance distance) for a respective one of the colors (e.g., red or green). In some embodiments, a blue resonance auxiliary layer is not included. For example, a separate resonance auxiliary layer disposed between the hole transport layer 174 and the blue light emission layer B and the auxiliary layer BIL may not be formed below the blue light emission layer B and the auxiliary layer BIL corresponding to the red light emission layer R or the green light emission layer G. In some embodiments, the auxiliary layer BIL physically contacts the hole transport layer 174.

Although not shown in FIG. 9, the hole injection layer 172 may be formed between the first electrode 160 and the hole transport layer 174 as in the exemplary embodiment described with reference to FIG. 6.

The description made with reference to FIG. 2 other than the aforementioned difference is applicable to the modification of FIG. 9.

By way of summation and review, an organic light emitting display device as a display device may have a wide viewing angle, outstanding contrast, and a fast response time. The organic light emitting display device may include an organic light emitting diode for emitting light, and, in the organic light emitting diode device, electrons injected from one electrode and holes injected from another electrode may be combined with each other in an emission layer, excitons may be generated, energy may be outputted from the excitons, and light may be emitted.

Provided are an organic light emitting diode and an organic light emitting display device including the same, which may exhibit high efficiency and a long lifespan. According to an exemplary embodiment, it may be possible to increase light emitting efficiency by forming the electron injection layer including a dipole material. According to an exemplary embodiment, it may be possible to increase light emitting efficiency of the blue emission layer by forming an auxiliary layer below the blue emission layer.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An organic light emitting diode, comprising:
a first electrode and a second electrode facing each other;
an emission layer between the first electrode and the second electrode; and
an electron injection layer between the second electrode and the emission layer, the electron injection layer including a metal having a work function of 4.0 eV or less and a dipole material including a first component and a second component having different polarities, wherein:

the electron injection layer further includes an oxide having relative permittivity of 10 or more, and the oxide includes one or more of $Cu_2O$, $Yb_2O_3$, $Sm_2O_3$, $Nb_2O_3$, $Gd_2O_3$, or $Eu_2O_3$.

2. The organic light emitting diode as claimed in claim 1, wherein the electron injection layer includes at least two oxides each having relative permittivity of 10 or more.

3. The organic light emitting diode as claimed in claim 1, wherein the dipole material has a dipole moment that is higher than that of LiF.

4. The organic light emitting diode as claimed in claim 3, wherein the first component includes one or more of an alkali metal, an alkaline earth metal, a rare earth metal, or a transition metal, and the second component includes a halogen.

5. The organic light emitting diode as claimed in claim 4, wherein the second component includes one or more of F, Cl, Br, or I.

6. The organic light emitting diode as claimed in claim 5, wherein the dipole material includes one or more of RbF, RbBr, RbCl, or RbI.

7. The organic light emitting diode as claimed in claim 6, wherein the metal having the work function of 4.0 eV or less includes one or more of Li, Na, K, Rb, Cs, Ca, Sr, Ba, Ce, Sm, Eu, Gd, La, Nd, Tb, Lu, Yb, Mg, or an alloy thereof.

8. The organic light emitting diode as claimed in claim 7, wherein the electron injection layer includes a dipole material including RbI and a metal including Mg.

9. The organic light emitting diode as claimed in claim 3, further comprising:

an electron transport layer between the emission layer and the electron injection layer; and a hole transport layer between the emission layer and the first electrode, wherein each of the hole transport layer and the electron transport layer includes an organic material.

10. The organic light emitting diode as claimed in claim 9, wherein the electron injection layer further includes an oxide having relative permittivity of 10 or more.

11. The organic light emitting diode as claimed in claim 10, wherein:

the electron injection layer has a structure including a plurality of layers, and each of the layers includes at least one of the dipole material, the metal having the work function of 4.0 eV or less, and the oxide having relative permittivity of 10 or more.

12. An organic light emitting display device, comprising:

a substrate;

a gate line on the substrate;

a data line and a driving voltage line;

a switching thin film transistor connected to the gate line and the data line;

a driving thin film transistor connected to the switching thin film transistor and the driving voltage line; and an organic light emitting diode connected to the driving thin film transistor, wherein the organic light emitting diode includes:

a first electrode and a second electrode facing each other;

an emission layer between the first electrode and the second electrode; and an electron injection layer between the second electrode and the emission layer, the electron injection layer including a metal having a work function of 4.0 eV or less and a dipole material including a first component and a second component having different polarities, wherein:

the electron injection layer further includes an oxide having relative permittivity of 10 or more, and the oxide includes one or more of $Cu_2O$, $Yb_2O_3$, $Sm_2O_3$, $Nb_2O_3$, $Gd_2O_3$, or $Eu_2O_3$.

13. The organic light emitting display device as claimed in claim 12, wherein the electron injection layer includes at least two oxides each having relative permittivity of 10 or more.

14. The organic light emitting display device as claimed in claim 12, wherein the dipole material has a dipole moment that is higher than that of LiF.

15. The organic light emitting display device as claimed in claim 14, wherein the first component includes one or more of an alkali metal, an alkaline earth metal, a rare earth metal, or a transition metal, and the second component includes a halogen.

16. The organic light emitting display device as claimed in claim 15, wherein the second component includes or more of F, Cl, Br, or I.

17. The organic light emitting display device as claimed in claim 16, wherein the dipole material includes or more of RbF, RbBr, RbCl, or RbI.

18. The organic light emitting display device as claimed in claim 17, wherein the metal having the work function of 4.0 eV or less includes one or more of Li, Na, K, Rb, Cs, Ca, Sr, Ba, Ce, Sm, Eu, Gd, La, Nd, Tb, Lu, Yb, Mg, or an alloy thereof.

19. The organic light emitting display device as claimed in claim 18, wherein the electron injection layer includes a dipole material including RbI and the metal having the work function of 4.0 eV or less includes Mg.

20. The organic light emitting display device as claimed in claim 14, wherein the first component has a work function of 3.0 eV or less, and includes one or more of Li, Na, K, Rb, Cs, Ca, Sr, Ba, Ce, Sm, Eu, Gd, Yb, or an alloy thereof.

21. The organic light emitting display device as claimed in claim 14, further comprising:

an electron transport layer between the emission layer and the electron injection layer; and a hole transport layer between the emission layer and the first electrode, wherein each of the hole transport layer and the electron transport layer includes an organic material.

22. The organic light emitting display device as claimed in claim 14, wherein:

the emission layer includes a red light emitting layer, a green light emitting layer, and a blue light emitting layer, and the organic light emitting display device further includes an auxiliary layer between the blue light emitting layer and the first electrode.

23. The organic light emitting display device as claimed in claim 22, further comprising a red resonance auxiliary layer disposed below the red light emission layer and a green resonance auxiliary layer disposed below the green light emission layer.

24. The organic light emitting display device as claimed in claim 22, wherein the auxiliary layer includes a compound represented by the following Chemical Formula 1:

Chemical Formula 1

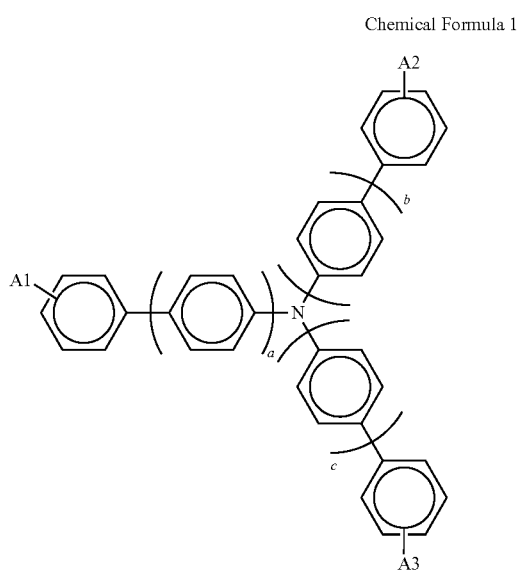

where each of "A1," "A2," and "A3" is hydrogen, carbazole, dibenzothiophene, dibenzofuran (DBF), or biphenyl, and each of "a," "b," and "c" is an integer in a range of from 0 and 4.

25. The organic light emitting display device as claimed in claim 22, wherein the auxiliary layer includes a compound represented by the following Chemical Formula 2:

Chemical Formula 2

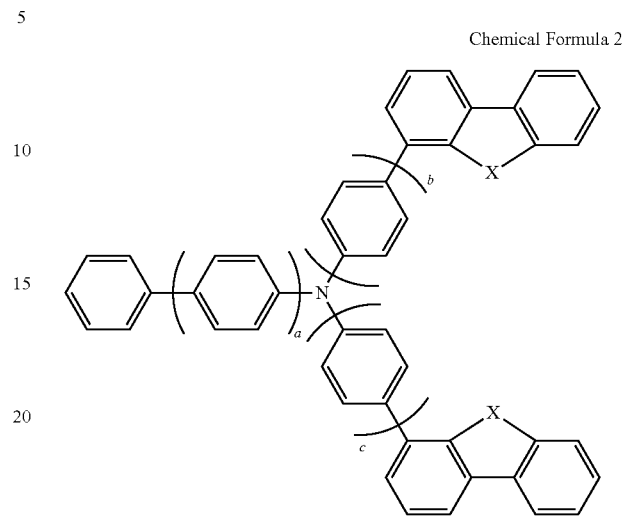

where each of "a," "b," and "c" is an integer in a range of from 0 to 3, "X" is selected from O, N, and S, and the elements selected for X are the same as or different from each other.

* * * * *